(12) United States Patent
Lee et al.

(10) Patent No.: US 12,374,272 B2
(45) Date of Patent: Jul. 29, 2025

(54) DISPLAY DEVICE

(71) Applicant: LG Display Co., Ltd., Seoul (KR)

(72) Inventors: Seungjae Lee, Goyang-si (KR); Jinho Kim, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/540,007

(22) Filed: Dec. 14, 2023

(65) Prior Publication Data

US 2024/0212586 A1 Jun. 27, 2024

(30) Foreign Application Priority Data

Dec. 21, 2022 (KR) .................. 10-2022-0180320

(51) Int. Cl.
| | | |
|---|---|---|
| *G09G 3/32* | (2016.01) | |
| *G09G 3/20* | (2006.01) | |
| *H01L 25/16* | (2023.01) | |
| *H10D 86/40* | (2025.01) | |
| *H10D 86/60* | (2025.01) | |

(52) U.S. Cl.
CPC ............. *G09G 3/32* (2013.01); *G09G 3/2092* (2013.01); *H01L 25/167* (2013.01); *H10D 86/441* (2025.01); *H10D 86/60* (2025.01); *G09G 2300/026* (2013.01); *G09G 2320/0252* (2013.01)

(58) Field of Classification Search
CPC .. G09G 3/32; G09G 3/2092; G09G 2300/026; G09G 2320/0252; G09G 2310/0202; G09G 2310/0243; G09G 2310/0264; G09G 2310/067; G09G 2330/06; H01L 25/167; H01L 27/124; H01L 25/0753; H01L 27/156; G09F 9/3023; G09F 9/33; H10D 86/441; H10D 86/60; H10H 29/142

See application file for complete search history.

(56) References Cited

U.S. PATENT DOCUMENTS

| | | | | |
|---|---|---|---|---|
| 10,152,914 | B2 * | 12/2018 | Meersman | G09G 3/32 |
| 11,217,736 | B2 * | 1/2022 | Su | H10H 20/855 |
| 2004/0016568 | A1 * | 1/2004 | Palanisamy | H10K 59/179 |
| | | | | 29/846 |
| 2007/0017168 | A1 * | 1/2007 | Lee | G09G 3/3275 |
| | | | | 52/783.1 |
| 2018/0323180 | A1 * | 11/2018 | Cok | G09G 3/2014 |
| 2021/0366374 | A1 * | 11/2021 | Wei | G09G 3/3233 |
| 2022/0208130 | A1 | 6/2022 | Park et al. | |

(Continued)

FOREIGN PATENT DOCUMENTS

KR 10-1859475 B1 5/2018

OTHER PUBLICATIONS

Office Action issued on Nov. 12, 2024 in Great Britain Patent Application No. GB2319535.7.

*Primary Examiner* — Mihir K Rayan
(74) *Attorney, Agent, or Firm* — Morgan, Lewis & Bockius LLP

(57) ABSTRACT

Disclosed is a display apparatus including a first panel, a second panel, and a control circuit configured to output a reference gate signal to the first panel and to output a timing-delayed gate clock signal to the second panel. At least one of the panels includes an upper substrate having a micro-LED mounted thereon and a lower substrate connected to the upper substrate via routing.

26 Claims, 10 Drawing Sheets

(56) References Cited

U.S. PATENT DOCUMENTS

| | | | |
|---|---|---|---|
| 2022/0223577 A1 | 7/2022 | Oh et al. | |
| 2022/0238496 A1* | 7/2022 | Takeya | H10H 20/01 |
| 2024/0023248 A1* | 1/2024 | Hasegawa | H05K 1/183 |
| 2024/0257782 A1* | 8/2024 | Kim | G09G 3/3677 |
| 2024/0304120 A1* | 9/2024 | Chung | H10D 86/60 |
| 2024/0313181 A1* | 9/2024 | Hsu | H01L 25/0753 |

* cited by examiner

⇨ Reference gate output signal

➡ Gate output signal to which timing dispersion/delay is applied

⇢ Compensation signal for timing of gate (shift register) output

DISPLAY DEVICE

CROSS-REFERENCE TO RELATED APPLICATION

This application claims the benefit of and priority to Korean Patent Application No. 10-2022-0180320 filed on Dec. 21, 2022, the entirety of which is incorporated herein by reference for all purposes.

BACKGROUND

Field

The present disclosure relates to a display device, and more specifically to a micro-LED display device (micro light-emitting diode display device) and a tiling display apparatus.

Description of Related Art

A display device is widely used not only as a display device of a television or a monitor but also as a display screen of a notebook computer, a tablet computer, a smart phone, a portable display device, and a portable information device.

Research and development on micro-LED display devices using a micro-LED as a light-emitting element is in progress. Because of its high-definition and high reliability, the micro-LED display device is in the limelight as a next-generation display device.

SUMMARY

There is difficulty in designing a tiling display apparatus comprising micro-LED display device(s) having a pseudo signal line for EMI (Electro Magnetic Interference) stabilization in an upper substrate due to limitation of a spatial pattern design of a high voltage gate signal line for supplying a high voltage gate signal to several blocks due to operation characteristics thereof.

Due to panel thickness, the micro-LED display device and the tiling display apparatus have limitations in designing a small spacing between a voltage electrode and a ground plane (GND Plane) to play a role in stabilizing panel common noise.

The micro-LED display device and the tiling display apparatus require dispersion of timing of a high voltage gate signal in order to avoid noise overlapping a gate clock signal that is outputted and operates at the same timing in an operation between units in a cabinet. The timing dispersion leads to a screen discontinuity.

The inventors of the present disclosure have developed a micro-LED display device and a tiling display apparatus capable of securing reduction of EMI of a gate clock signal without interference in an operation of a light-emissive area within the structural limitations of the pattern design.

A technical purpose according to an embodiment of the present disclosure is to provide a micro-LED display device and a tiling display apparatus in which a pattern and a circuit for reducing noise in a low frequency band are designed in a lower substrate to cancel EMI caused by a gate clock signal in the upper substrate.

Moreover, a technical purpose according to an embodiment of the present disclosure is to provide a micro-LED display device and a tiling display apparatus in which a conductive adhesive is applied between an upper substrate and a lower substrate, thereby securing a stable voltage supply.

Moreover, a technical purpose according to an embodiment of the present disclosure is to provide a micro-LED display device and a tiling display apparatus capable of supplying a phase compensation signal through a lower substrate to prevent the screen discontinuity due to timing dispersion.

Purposes according to the present disclosure are not limited to the above-mentioned purposes. Other purposes and advantages according to the present disclosure that are not mentioned may be understood based on the following descriptions, and may be more clearly understood based on embodiments according to the present disclosure. Further, it will be easily understood that the purposes and advantages according to the present disclosure may be realized using means shown in the claims or combinations thereof.

A micro-LED display device according to an embodiment of the present disclosure includes an upper substrate having a micro-LED mounted thereon, wherein a gate clock line arranged to receive a gate clock signal is disposed on the upper substrate; and a lower substrate connected to the upper substrate via a routing, wherein a base voltage line arranged to receive a base voltage is disposed on the lower substrate. In this regard, a pseudo signal line arranged to receive a pseudo signal for canceling noise generated by the gate clock signal is disposed on the lower substrate.

A tiling display apparatus according to an embodiment of the present disclosure includes a first panel, a second panel, wherein each panel comprises a micro-LED display device of the previous embodiment: and a control circuit configured to output a reference gate signal to the first panel and to output a timing-delayed gate clock signal to the second panel.

According to the embodiments, EMI caused by the gate clock signal of the upper substrate may be cancelled by designing a pattern and a circuit for reducing low-frequency noise in the lower substrate of the micro-LED display device.

Moreover, a stable voltage supply may be guaranteed by applying the conductive adhesive between the upper substrate and the lower substrate.

Moreover, supplying the phase compensation signal through the lower substrate may allow prevention of screen discontinuity due to timing dispersion.

Moreover, the EMI caused by the gate clock signal (or gate clock EMI) may be reduced without interfering with the operation of the light-emissive area within the structural limitations of the pattern design in the micro-LED display device or a micro-LED unit.

Moreover, the side effects of the timing dispersion technology applied to solve the noise overlapping phenomenon may be reduced.

Moreover, EMI may be reduced due to the presence of the ground plane between the upper substrate and the lower substrate.

Moreover, the conductive adhesive and the sealant may be applied for fixation of the upper and lower substrates to each other such that the ground plane may be expanded.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

DETAILED DESCRIPTIONS

Figure 1:
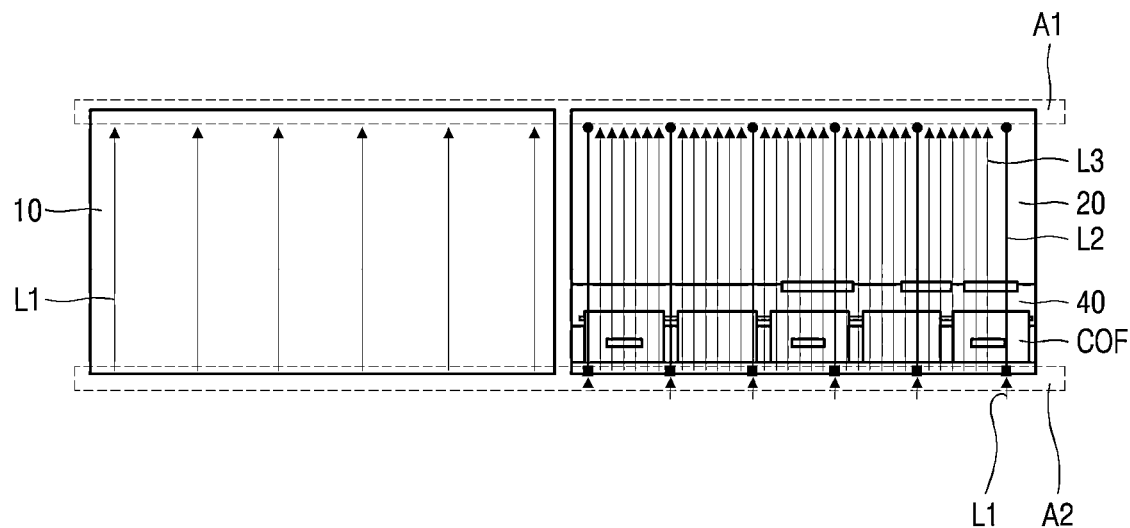
FIG. 1 is a diagram of a micro-LED display device according to an embodiment in which an upper substrate and a lower substrate are separated from each other and are unfolded.

Advantages and features of the present disclosure, and a way or method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element or layer may be disposed directly on the second element or layer or may be disposed indirectly on the second element or layer with a third element or layer being disposed between the first and second elements or layers. It will be understood that when an element or layer is referred to as being "connected to" another element or layer, it may be directly connected to the another element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on top" of another layer, film, region, plate, or the like, the former may directly contact the latter or still another layer, film, region, plate, or the like may be disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range even if there is no separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments" "examples" "aspects", and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

In description of flow of a signal, for example, when a signal is delivered from a node A to a node B, this may include a case where the signal is transferred from the node A to the node B via another node unless a phrase 'immediately transferred' or 'directly transferred' is used.

Hereinafter, a micro-LED display device according to some embodiments will be described.

As used herein, a pseudo signal may be defined as a signal that cancels noise by reducing a peak current generated during a transition period of a gate clock signal used to drive a micro-LED. In one example, the pseudo signal may be designed to have a pattern of a signal obtained by inverting the gate clock signal.

FIG. 1 is a diagram of a micro-LED display device according to an embodiment in which an upper substrate and a lower substrate are separated from each other and are unfolded.

FIG. 1 shows a diagram in which an upper substrate 10 and a lower substrate 20 are separated from each other and are unfolded for convenience of illustration. A printed circuit board 40 and a COF (Chip On Film) are attached to a rear surface of the lower substrate 20. Rear surfaces of the upper substrate 10 and the lower substrate 20 may be adhered and fixed to each other.

Figure 2:
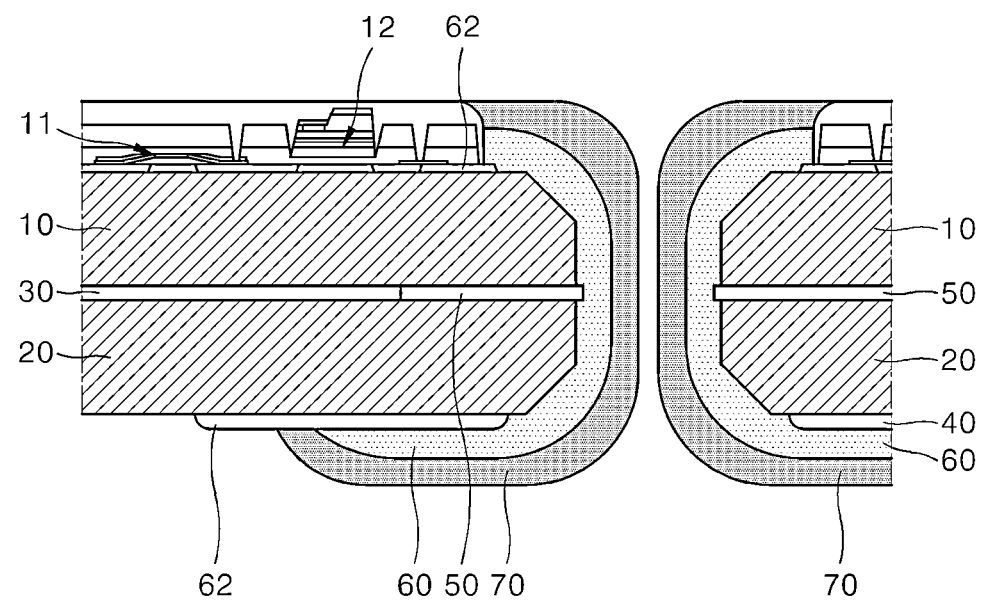
FIG. 2 is a cross-sectional view of a tiling display apparatus according to an embodiment.

FIG. 2 is a cross-sectional view of a tiling display apparatus according to an embodiment.

Referring to FIG. 1 and FIG. 2, each of a micro-LED display device and a tiling display apparatus according to an embodiment includes the upper substrate 10 and the lower substrate 20. Each of the upper substrate 10 and the lower substrate 20 may be a glass substrate. However, the present disclosure is not limited thereto, and each of the upper substrate 10 and the lower substrate 20 may be made of a flexible material such as polyimide.

A micro-LED 12 and a thin-film transistor 11 are mounted on the upper substrate 10, and a gate clock line L1 supplying a gate clock signal is disposed on the upper substrate 10.

The micro-LED 12 may be an LED of a size of 100 μm or smaller, or an LED free of a wafer.

The thin-film transistor 11 may act as a driving transistor operating in response to a data voltage or an emission transistor operating in response to an emission signal. The driving transistor and the emission transistor generate a current path to deliver a current to the micro-LED 12 to cause the micro-LED 12 to emit light. In one example, the micro-LED display device may control a pulse width of the emission signal to determine an intensity of current of the current path.

The upper substrate 10 and the lower substrate 20 are connected to each other via a routing 60. Each of the upper substrate 10 and the lower substrate 20 has a pad 62 disposed thereon. The routing 60 connects the pad 62 of the upper substrate 10 and the pad 62 of the lower substrate 20 to each other.

A conductive adhesive 30 and a sealant 50 are disposed between the upper substrate 10 and the lower substrate 20. The sealant 50 is disposed between the conductive adhesive 30 and the routing 60 so as to insulate the conductive adhesive 30 and the routing 60 from each other.

The lower substrate 20 is connected to the upper substrate 10 via the routing 60. A base voltage line (or power line) L3 to which a power voltage is supplied is disposed on the lower substrate 20. The power voltage may be a base voltage EVSS or a high-potential voltage EVDD.

In one example, in the micro-LED display device, the upper substrate 10 including a light-emissive area and the lower substrate 20 on which the printed circuit board 40 for generating a micro-LED driving signal is mounted are bonded to each other via at least one of the conductive adhesive 30 and the sealant 50 in order to implement a seamless tiling between units composed of the upper substrate 10 and the lower substrate 20. In a tiling display apparatus, a seam may mean the gap between units, and the seamless tiling may mean minimizing the gap between units.

A base voltage (EVSS) signal line that guarantees a 0V potential is disposed on the lower substrate 20. The lower substrate 20 is connected to the upper substrate 10 via an upper side routing. All other signal lines other than the base voltage (EVSS) signal line are connected to the printed circuit board 40 via a lower side routing.

In this regard, the upper side routing may be defined as a routing connecting the upper substrate 10 and the lower substrate 20 to each other in an upper side area A1. The lower side routing may be defined as a routing connecting the upper substrate 10 and the lower substrate 20 to each other in a lower side area A2. The routing 60 in FIG. 2 may be the upper side routing or the lower side routing. Upper side area A1 and lower side area A2 may be known as first side area A1 and second side area A2.

A driving circuit for driving a pixel circuit may be mounted on the printed circuit board 40. A signal line that transmits a signal of the driving circuit to a display panel may be mounted on the COF.

A pseudo signal line L2 is disposed on the lower substrate 20. A pseudo signal to cancel out noise generated by the gate clock signal is supplied to the pseudo signal line L2.

The pseudo signal is supplied to the pseudo signal line L2 of the lower substrate 20, and has the same pattern as that of an inverted signal obtained by inverting the gate clock signal supplied to the gate clock line L1 of the upper substrate 10. The pseudo signal cancels the noise by reducing the peak current generated during the transition period of the gate clock signal.

In one example, the inverted signal pattern may be designed as a pattern obtained by inverting a gate clock signal pattern, and may be used as a signal for cancelling a high voltage signal output from a level shifter. In one example, an inverting circuit for inverting a level shifter output may be designed on the printed circuit board 40 or the lower substrate 20. The inverting circuit may be disposed at one side adjacent to the upper side area A1 or the lower side area A2 and on the lower substrate 20.

FIG. 3 to FIG. 6 are diagrams illustrating an inverting circuit of a micro-LED display device according to an embodiment. As shown in FIGS. 3 to 6, an inverter circuit IV1 may be disposed on any one of the upper substrate 10, the lower substrate 20, and the printed circuit board 40. Additionally, a pseudo signal for EMI cancellation may be generated by inverting circuit IV1. The gate clock line L1 is patterned on the upper substrate 10 and a pseudo signal line L2 is patterned on the lower substrate 20. This improves EMI.

Figure 3:
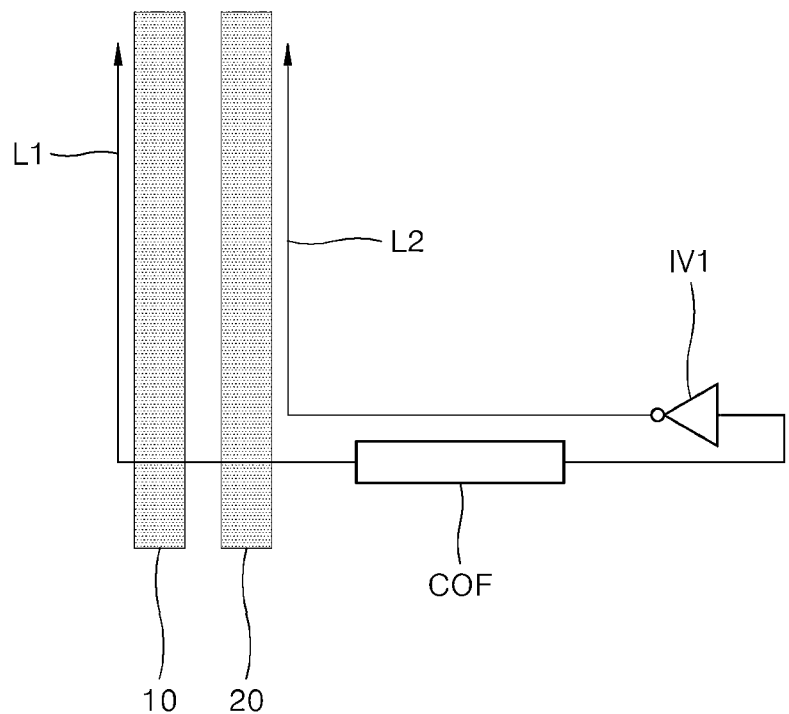
FIG. 3 to FIG. 6 are diagrams illustrating an inverting circuit of a micro-LED display device according to an embodiment.

Referring to FIG. 3, the micro-LED display device includes an inverting circuit IV1 that supplies the inverted signal obtained by inverting the gate clock signal, as a pseudo signal, to the pseudo signal line L2.

In one example, the inverting circuit IV1 may be mounted on the printed circuit board 40 that generates the driving signal of the micro-LED. A gate clock generation circuit of the printed circuit board 40 supplies the gate clock signal to the gate clock line L1 disposed on the upper substrate 10 via the COF (Chip On Film).

The inverting circuit IV1 of the printed circuit board 40 supplies the inverted signal obtained by inverting the gate clock signal, as the pseudo signal, to the pseudo signal line L2 disposed on the lower substrate 20.

Figure 4:
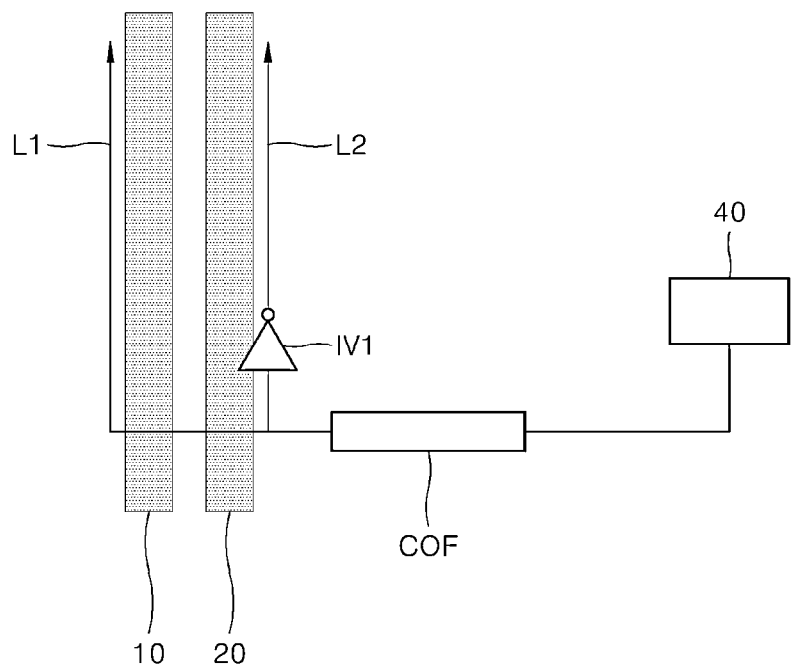
Figure 5:
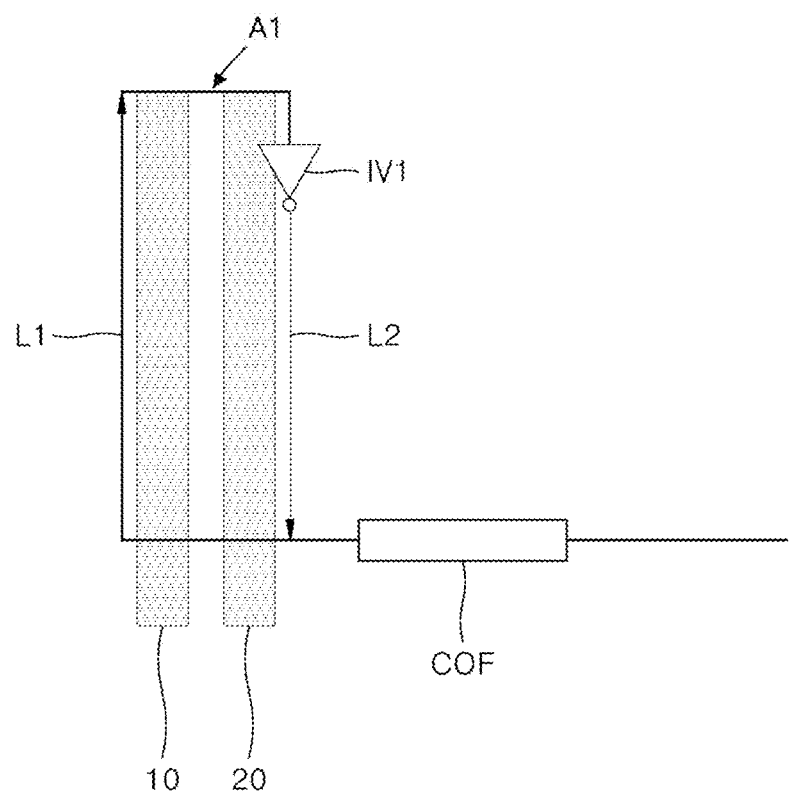

In another example, referring to FIGS. 4 and 5, the inverting circuit IV1 may be mounted on the lower substrate 20 and between the pseudo signal line L2 and the printed circuit board 40 generating the micro-LED driving signal.

In one example, as shown in FIG. 4, the inverting circuit IV1 may be mounted on the rear surface of the lower substrate 20 and at a position adjacent to a position of the rear surface to which the COF is attached. The gate clock generation circuit of the printed circuit board 40 supplies the gate clock signal to the gate clock line L1 disposed on the upper substrate 10 via the COF (Chip On Film).

The gate clock generation circuit of the printed circuit board 40 supplies the gate clock signal, via the COF (Chip On Film), to the inverting circuit IV1 mounted on the rear surface of the lower substrate 20 and at a position adjacent to a position of the rear surface to which the COF is attached. The inverting circuit IV1 mounted on the rear surface of the lower substrate 20 and at a position adjacent to a position of the rear surface to which the COF is attached supplies the inverted signal obtained by inverting the gate clock signal, as the pseudo signal, to the pseudo signal line L2 which is disposed on the rear surface of the lower substrate 20.

In another example, as shown in FIG. 5, the inverting circuit IV1 may be mounted on the rear surface of the lower substrate 20 and at one side adjacent to the upper side area A1. The gate clock generation circuit of the printed circuit board 40 supplies the gate clock signal to the gate clock line L1 disposed on the upper substrate 10 via the COF (Chip On Film).

The gate clock signal is supplied to the inverting circuit IV1 mounted on the rear surface of the lower substrate 20 and at one side adjacent to the upper side area A1 via the gate clock line L1. The inverting circuit IV1 at one side adjacent to the upper side area A1 supplies the inverted signal obtained by inverting the gate clock signal, as the pseudo signal, to the pseudo signal line L2 disposed on the lower substrate 20.

Figure 6:
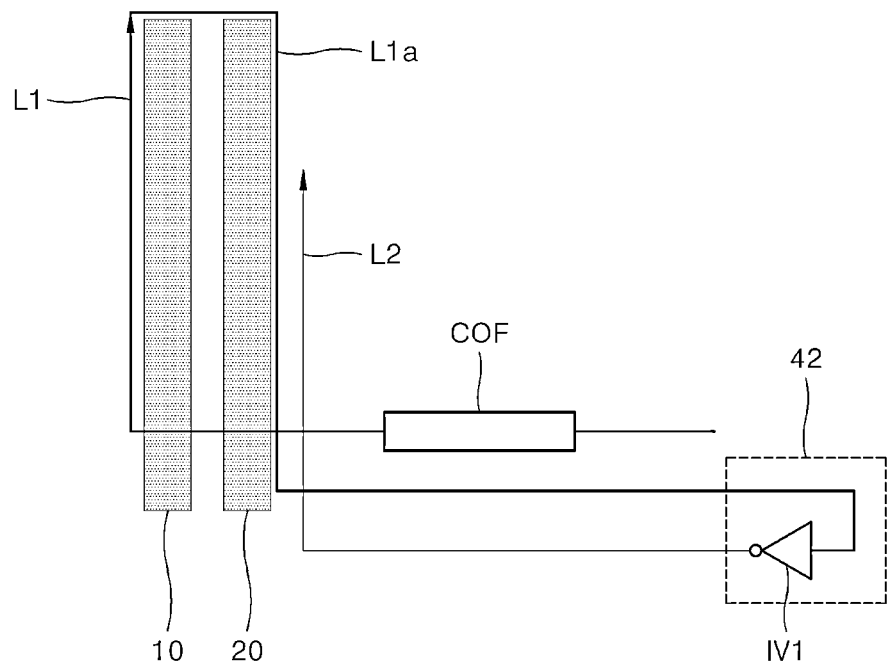

In another example, as shown in FIG. 6, an auxiliary gate clock line L1a connected to the gate clock line L1 of the upper substrate 10 is disposed on the lower substrate 20. The auxiliary gate clock line L1a is connected to a slew compensation circuit 42. The slew compensation circuit 42 may be disposed on the printed circuit board 40.

The slew compensation circuit 42 senses the gate clock signal transmitted from the auxiliary gate clock line L1a and generates a compensated inverted signal pattern compensated for based on a slew of the gate clock signal and supplies the compensated inverted signal pattern to the pseudo signal line L2 as the pseudo signal. In one example, a slew may occur at a rising edge or a falling edge of the gate clock signal due to an impedance of the gate clock line. Thus, the slew compensation circuit 42 generates the compensated inverted signal pattern compensated for based on the slew occurring at a rising edge or a falling edge of the gate clock signal.

Figure 7:
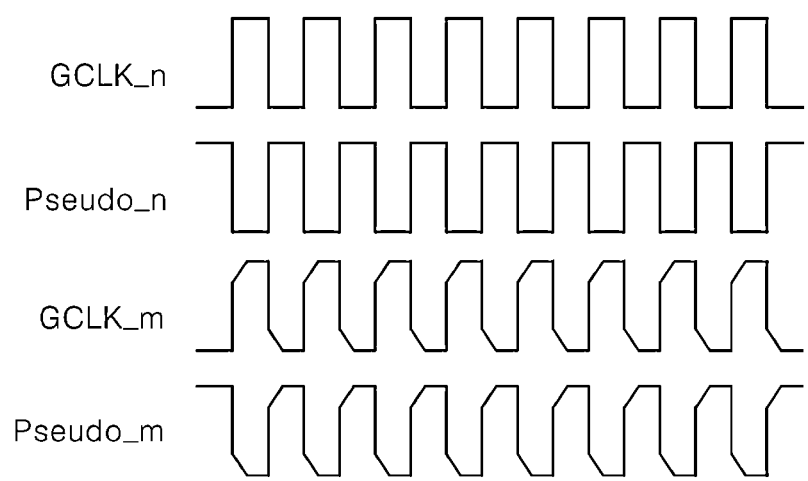
FIG. 7 is a waveform diagram of a gate clock signal and a pseudo signal in a micro-LED display device according to an embodiment.
Figure 8:
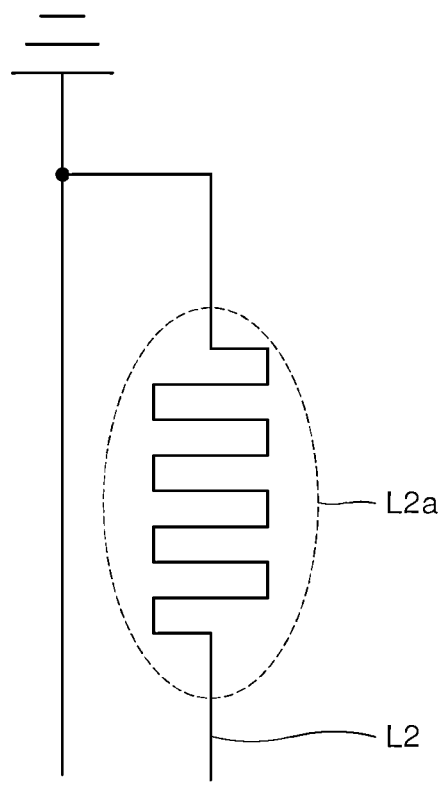
FIG. 8 and FIG. 9 are diagrams illustrating a termination pattern of the pseudo signal line in FIG. 1.
Figure 9:
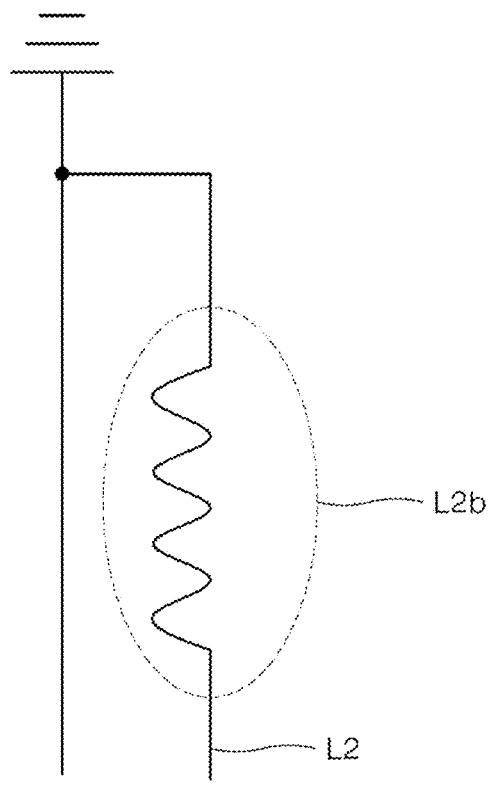

FIG. 7 is a waveform diagram of a gate clock signal and a pseudo signal in a micro-LED display device according to an embodiment. FIG. 8 and FIG. 9 are diagrams illustrating a termination pattern of the pseudo signal line in FIG. 1.

As shown in FIG. 7, a gate clock signal GCLK_n may be defined as an ideal signal that is not affected by the impedance of the gate clock line. A gate clock signal GCLK_m may be defined as a signal having the slew in rising and falling edges due to the impedance of the gate clock line.

A pseudo signal Pseudo_n has the same pattern as an inverted signal obtained by inverting the gate clock signal GCLK_n. In one example, the pseudo signal Pseudo_n may be designed to have the same rising and falling edges as inverted rising and falling edges of the gate clock signal GCLK_n of the gate clock signal line of the upper substrate 10.

A pseudo signal Pseudo_m has the same pattern as an inverted signal obtained by inverting the gate clock signal GCLK_m. In one example, the pseudo signal Pseudo_m may be designed to have the same rising and falling edges as inverted rising and falling edges of the gate clock signal GCLK_m affected by the impedance of the gate clock line.

In another example, as shown in FIGS. 8 and 9, a termination of the pseudo signal line L2 may be formed in a serpent pattern in consideration of the slew of the gate clock signal due to the impedance of the gate clock line. In this regard, the termination may be defined as an end of the pseudo signal line L2 adjacent to a ground.

As shown in FIG. 8, the end of the pseudo signal line L2 may be formed in a pulse-shaped serpent pattern L2a. Alternatively, as shown in FIG. 9, the end of the pseudo signal line L2 may be formed in a gently curved serpent pattern L2b.

A length of the end of the pseudo signal line L2 may be determined based on the impedance of the gate signal line. Depending on the length, the end thereof may be formed in the pulse-shaped serpent pattern L2a or the gently curved serpent pattern L2b.

That is, the pattern of the end of the pseudo signal line L2 may be designed with consideration of the slew of the gate clock signal due to the impedance of the gate signal line such that the impedance of the pseudo signal line is adjusted to be equal to the impedance of the gate signal line. Thus, the inverted signal obtained by inverting the gate clock signal would be exactly inverse to the gate clock signal and would therefore be an accurate pseudo signal.

Figure 10:
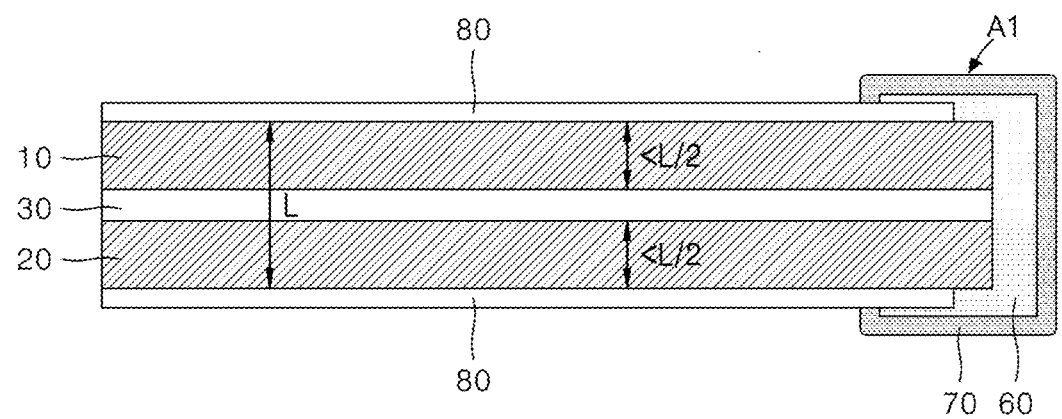
FIG. 10 is a cross-sectional view of an upper side area of a micro-LED display device according to an embodiment.
Figure 11:
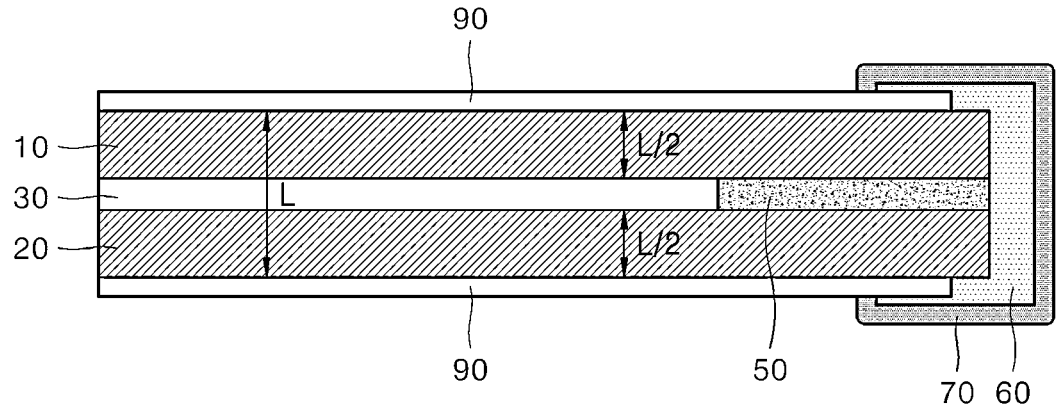
FIG. 11 is a cross-sectional view of a lower side area of a micro-LED display device according to an embodiment.

FIG. 10 is a cross-sectional view of an upper side area of a micro-LED display device according to an embodiment. FIG. 11 is a cross-sectional view of a lower side area of a micro-LED display device according to an embodiment.

Referring to FIG. 1, FIG. 10 and FIG. 11, the upper substrate 10 and the lower substrate 20 are connected to each other via an upper routing of the upper side area A1 and a lower routing of the lower side area A2.

As shown in FIG. 10, in the upper side area A1, the conductive adhesive 30 is disposed between the upper substrate 10 and the lower substrate 20.

The routing 60 connects a base voltage electrode 80 of the upper substrate 10 and a base voltage electrode 80 of the lower substrate 20 to each other via a routing 60 of the upper side area A1. The conductive adhesive 30 serves as a reference plane between the upper substrate 10 and the lower substrate 20 in the upper side area A1 such that a distance between the base voltage electrode 80 of the upper substrate 10 or the lower substrate 20 and the reference plane may be reduced to less than a half of that in a conventional case.

In the lower side area A2, as shown in FIG. 11, the conductive adhesive 30 and the sealant 50 are disposed between the upper substrate 10 and the lower substrate 20. The sealant 50 is disposed between the conductive adhesive 30 and the routing 60 of the lower side area A2 so as to insulate the conductive adhesive 30 and the routing 60 from each other.

A signal electrode 90 other than the base voltage electrode of the upper substrate 10 and a signal electrode 90 other than the base voltage electrode of the lower substrate 20 are connected to each other via the routing 60. The routing 60 may be made of silver (Ag). A sealing portion 70 sealing the routing 60 may be made of an insulating material. The material of the routing 60 is not limited thereto and may include a conductive material other than silver (Ag). For example, the sealing portion 70 may be made of polyethylene, natural rubber, polyester, epoxy resin, or synthetic resin.

The reference plane (conductive adhesive 30) of the micro-LED is designed in this way. The reference plane is connected to the ground and acts as a ground plane. Hence, an additional plane serving as a ground plane is disposed between the upper substrate 10 and the lower substrate 20. In this regard, the ground plane serves to allow a potential reference of the upper substrate 10 and a potential of the lower substrate 20 to be equal to each other. Moreover, the ground plane serves to dissipate the EMI generated in the upper substrate 10 or the lower substrate 20 to the ground.

In the lower side area A2, a distance from the reference plane to the signal electrode 90 may be reduced to a value smaller than L/2 due to the conductive adhesive 30 and the sealant 50 disposed between the upper substrate 10 and the lower substrate 20. Since the distance from the reference plane to the signal electrode 90 is reduced to a value smaller than L/2, when EMI is generated in the upper substrate 10 or the lower substrate 20, the EMI can be quickly emitted to the ground through the reference plane. The conductive adhesive 30 is connected to the ground and acts as the reference plane. The reference plane serves to allow a potential of the upper substrate 10 and a potential of the lower substrate 20 to be equal to each other. Moreover, the reference plane serves to dissipate the EMI generated in the upper substrate 10 or the lower substrate 20 to ground. In this regard, L may be defined as a distance between the electrodes of upper substrate 10 and the lower substrate 20.

The distance between the electrode on the upper substrate 10 and the reference plane or the distance between the electrode on the lower substrate 20 and the reference plane may be reduced due to the conductive adhesive 30 disposed between the upper substrate 10 and the lower substrate 20 connected to the ground, such that the potential reference of each of the upper substrate 10 and the lower substrate 20 may be rapidly set, and the EMI generated in the upper substrate 10 or the lower substrate 20 may be quickly dissipated to the ground. The ground plane may be disposed between the upper substrate 10 and the lower substrate 20 such that an EMI reducing effect may be expected. Moreover, in the lower side area, the sealant 50 may be connected to the signal electrode 90 via the routing 60.

Figure 12:
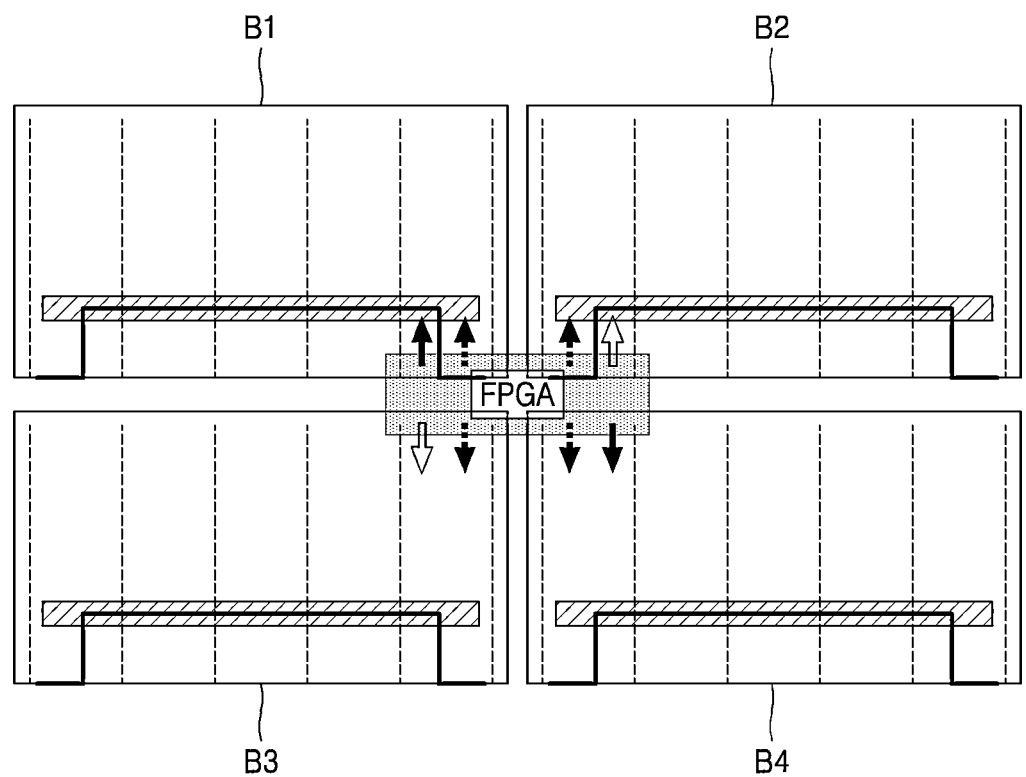
FIG. 12 is a diagram of a tiling display apparatus according to an embodiment.

FIG. 12 is a diagram of a tiling display apparatus according to an embodiment.

Figure 13:
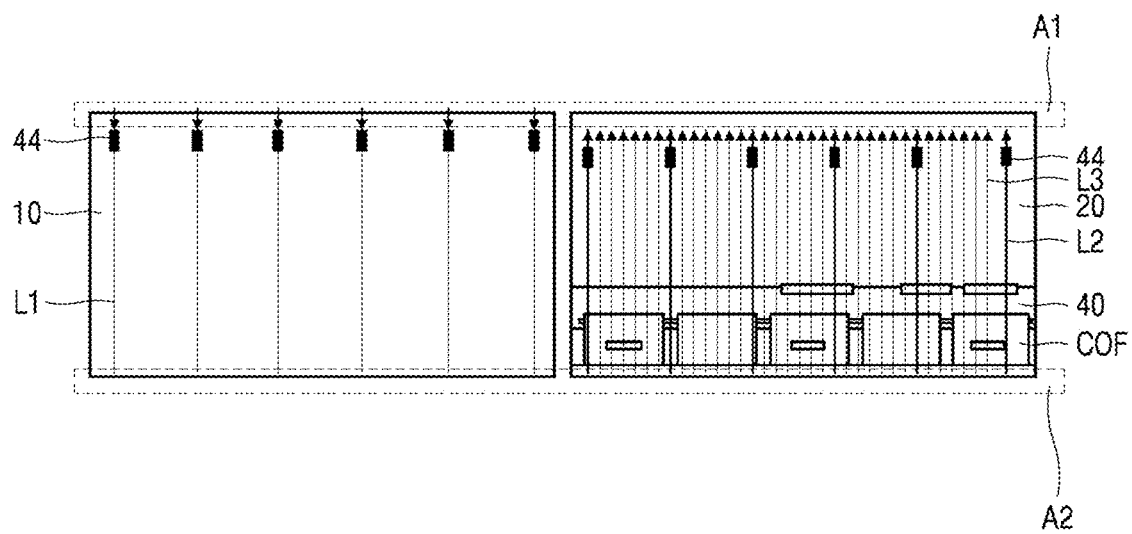
FIG. 13 is a diagram of one micro-LED display device in FIG. 12 in which an upper substrate and a lower substrate are separated from each other and are unfolded.

FIG. 13 is a diagram showing one micro-LED display device (or one panel) of FIG. 12.

FIG. 13 is a diagram of one micro-LED display device in FIG. 12 in which an upper substrate and a lower substrate are separated from each other and are unfolded. The printed circuit board 40 and the COF are attached to the rear surface of the lower substrate 20. The rear surfaces of the upper substrate 10 and the lower substrate 20 may be adhered and fixed to each other.

Figure 14:
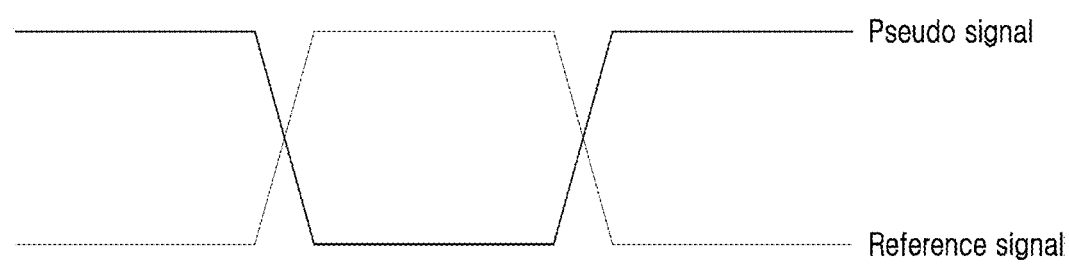
FIG. 14 is a waveform diagram for illustrating noise cancellation in a micro-LED display device according to an embodiment.

FIG. 14 is a waveform diagram for illustrating noise cancellation in a micro-LED display device according to an embodiment.

In FIG. 14, a reference signal may be defined as a reference signal used for a shift register to generate a gate clock signal. A pseudo signal may be defined as a signal used to cancel out noise by reducing the peak current generated during a transition period of the gate clock signal.

Referring to FIG. 12 to FIG. 14, the tiling display apparatus according to an embodiment includes a first panel B1, a second panel B2, a third panel B3, a fourth panel B4, and a control circuit FPGA (Field Programmable Gate Array). The control circuit is arranged to control each of the panels B1, B2, B3, B4. The control circuit may control panels B1, B2, B3, B4 simultaneously. Alternatively, the control circuit may control panels B1, B2, B3, B4 sequentially. The control circuit FPGA may be positioned in the middle of the four panels when the four panels are tiled together. This can prevent screen steps caused by differences in gate output timing.

The control circuit FPGA outputs a reference gate signal to the second panel B2 and the third panel B3 and outputs a timing-delayed gate clock signal to the first panel B1 and the fourth panel B4.

Each of the first panel B1, the second panel B2, the third panel B3 and the fourth panel B4 includes the upper substrate 10 and the lower substrate 20. The upper substrate 10 and the lower substrate 20 are connected to each other via the routing 60. The routing 60 includes an upper routing and a lower routing. The upper routing is disposed in the upper side area A1 and the lower routing is disposed in the lower side area A2.

A dispersion compensation circuit 44 that compensates for a timing of each of the timing-delayed gate clock signal and the reference gate signal is disposed on at least one of the upper substrate 10 and the lower substrate 20.

The dispersion compensation circuit 44 may be disposed on at least one of the upper substrate 10 and the lower substrate 20. In one example, the dispersion compensation circuit 44 may be disposed at the gate clock line L1 of the upper substrate 10 adjacent to the routing of the upper side area. Alternatively, the dispersion compensation circuit 44 may be disposed at the pseudo signal line L2 of the lower substrate 20 adjacent to the routing of the upper side area. The dispersion compensation circuit 44 may be disposed adjacent to the upper side area A1 to compensate for the distributed timing of the gate clock signal before gate signals are output to gate lines of the display panel.

A micro-LED is mounted on the upper substrate 10, and the gate clock line L1 to which the gate clock signal is supplied is disposed on the upper substrate 10. On the lower substrate 20, base voltage lines L3 is disposed. The base voltage lines L3 is connected to the upper substrate 10 via the routing and receives the base voltage. The pseudo signal line L2 to which the pseudo signal to cancel noise generated by the gate clock signal is supplied is disposed on the lower substrate 20.

In one example, two or more panels operating under one control circuit FPGA may employ a timing dispersion technology to prevent gate clock noises from overlapping each other. A phase compensation signal PSC (Phase Shift Compensation CLK) may be added to the shift register in the control circuit FPGA and the gate clock signal is supplied to the panel, that is, a display panel.

The control circuit FPGA outputs a reference gate signal to the second panel B2 and the third panel B3 and supplies a timing-delayed gate clock signal to the first panel B1 and the fourth panel B4. Alternatively, the control circuit FPGA outputs the timing-delayed gate clock signal to the second panel B2 and the third panel B3 and supplies the reference gate signal to the first panel B1 and the fourth panel B4 via a level shifter. In one example, a level shifter of the second panel B2 outputs a level shifted output signal using the reference gate signal and a level shifter of the first panel B1 outputs a level shifted output signal using the timing-delayed gate clock signal, such that the output timing may be dispersed.

The dispersion compensation circuit 44 is disposed on at least one of the upper substrate 10 and the lower substrate 20 so as to prevent the screen discontinuity caused by a difference between the gate output timings due to the timing dispersion. In this regard, the screen discontinuity may refer to differences between timings of images respectively displayed on the first panel B1 to the fourth panel B4 by way of example.

In one example, the dispersion compensation circuit 44 is designed to supply a shift register compensation signal to the gate clock line L1 of the upper substrate 10. For example, the dispersion compensation circuit 44 may be added to a dummy gate driver block in the upper substrate 10. Moreover, a portion of the base voltage signal lines L3 on the lower substrate 20 may be removed, and the dispersion compensation circuit 44 may be positioned where the portion of base voltage signal lines L3 have been removed from.

The dispersion compensation circuit 44 compensates the gate clock signal timing-dispersed and delayed relative to the reference gate signal for the timing thereof and supplies the compensated gate clock signal to the gate clock line L1 of the upper substrate 10.

In one example, the dispersion compensation circuit 44 may be disposed at the gate clock line L1 of the upper substrate 10 adjacent to the routing of the upper side area. Alternatively, the dispersion compensation circuit 44 may be disposed at the pseudo signal line L2 of the lower substrate 20 adjacent to the routing of the upper side area.

Figure 15:
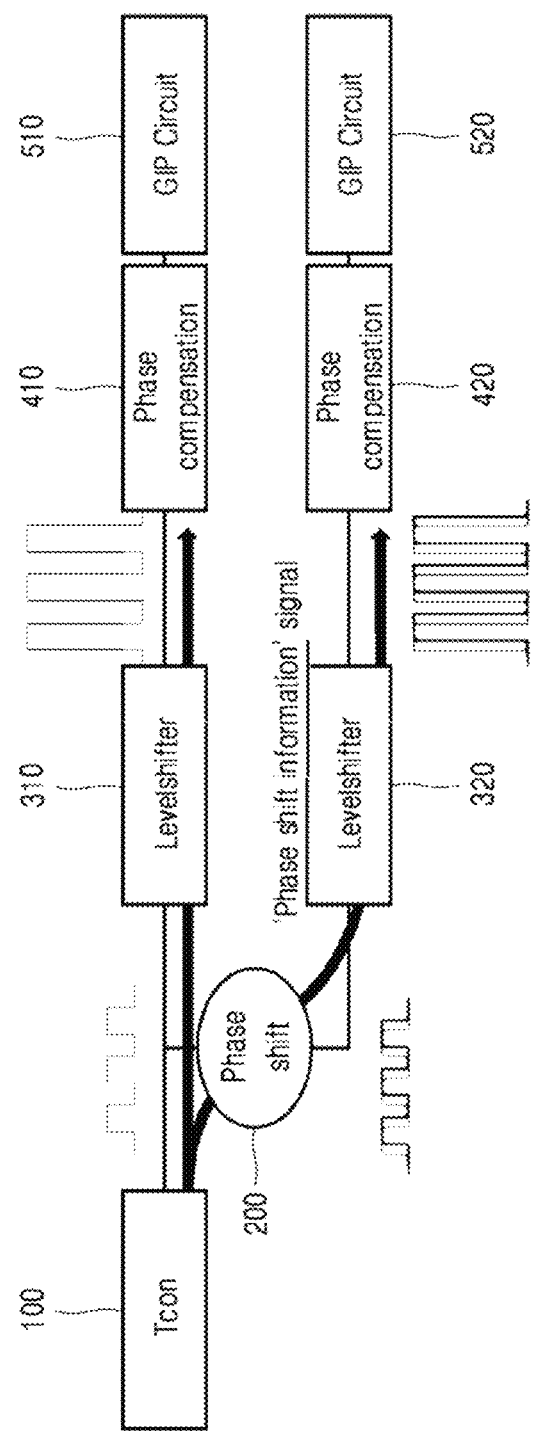
FIG. 15 is a block diagram of a gate signal generator in a micro-LED display device according to an embodiment.
Figure 16:
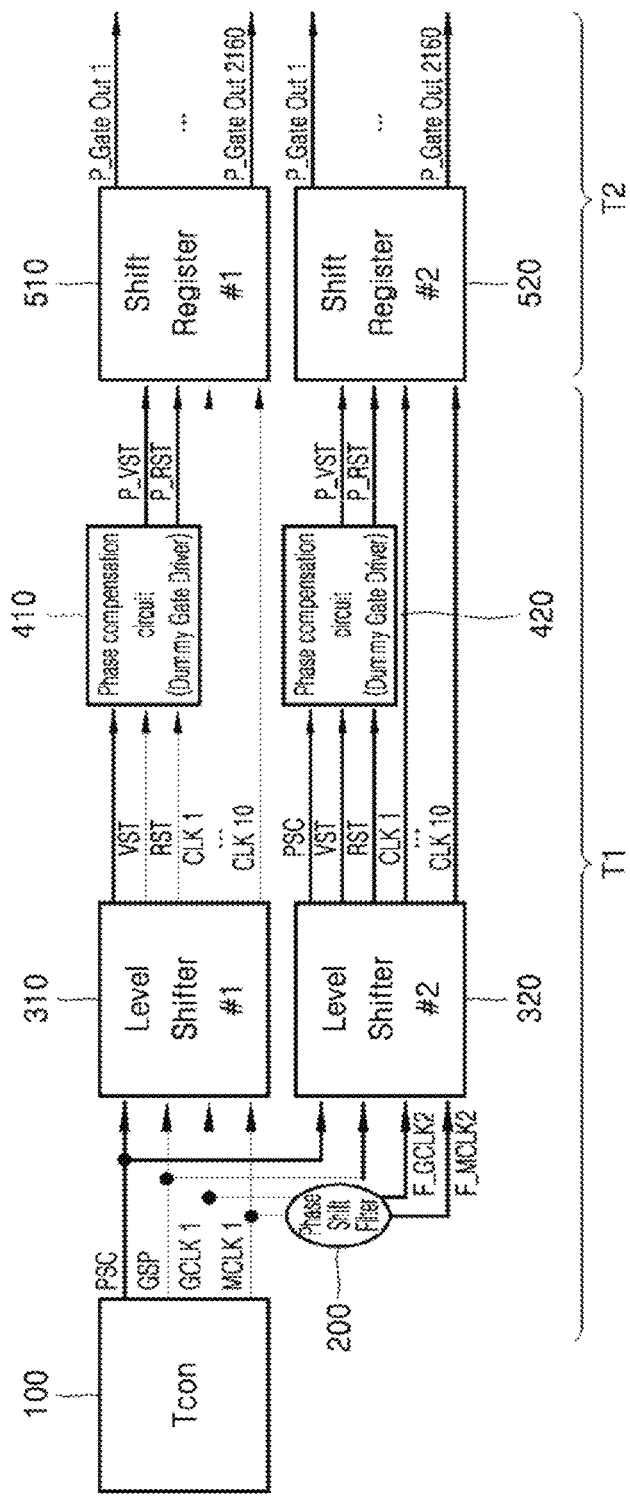
FIG. 16 is a detailed block diagram of the gate signal generator in the micro-LED display device of FIG. 15.

FIG. 15 is a block diagram of a gate signal generator in a micro-LED display device according to an embodiment. FIG. 16 is a detailed block diagram of the gate signal generator in the micro-LED display device of FIG. 15. FIG. 15 and FIG. 16 show the timing dispersion of an output signal from a level shifter.

Referring to FIG. 15 and FIG. 16, the gate signal generator includes a phase shift filter 200, a first level shifter 310, a second level shifter 320, a first phase compensation circuit 410, a second phase compensation circuit 420, a first GIP (Gate In Panel) circuit 510 and a second GIP circuit 520. In this regard, each of the first GIP circuit 510 and the second GIP circuit 520 may be composed of a shift register, and may be referred to as a first shift register 510 and a second shift register 520.

The gate signal generator receives a phase compensation signal PSC, a gate start pulse GSP, a gate clock signal GCLK1, and a master clock signal MCLK1 from a timing controller 100. Based on the phase compensation signal PSC, the gate start pulse GSP, the gate clock signal GCLK1, and the master clock signal MCLK1, the gate signal generator generates a first gate signal P_Gate Out 1 to a 2160-th gate signal P_Gate Out 2160, and sequentially outputs the generated first gate signal P_Gate Out1 to 2160-th gate signal P_Gate Out 2160 respectively to gate lines of the display panel.

The first level shifter 310 receives the phase compensation signal PSC, the gate start pulse GSP, the gate clock signal GCLK1, and the master clock signal MCLK1 from the timing controller 100. The first level shifter 310 transfers the phase compensation signal PSC to the first phase compensation circuit 410 and outputs a start signal VST and a reset signal RST to the first phase compensation circuit 410 in response to the gate start pulse GSP. The first level shifter 310 generates a first clock signal CLK1 to a tenth clock signal CLK10 based on the gate clock signal GCLK1 and the master clock signal MCLK1, and outputs the first clock signal CLK1 to the tenth clock signal CLK10 to the first shift register 510.

The phase shift filter 200 receives the gate clock signal GCLK1 and the master clock signal MCLK1 from the timing controller 100, and delays output timing of the gate clock signal GCLK1 and the master clock signal MCLK1 from the timing controller 100 and outputs the timing-delayed gate clock signal F_GCLK2 and the timing-delayed master clock signal F_MCLK2 to the second level shifter 320. That is, the phase shift filter 200 delays the phases of the gate clock signal GCLK1 and the master clock signal MCLK1 to reduce EMI through timing dispersion and provides them to the second level shifter 320.

The second level shifter 320 receives the phase compensation signal PSC and the gate start pulse GSP from the timing controller 100. The second level shifter 320 transfers the phase compensation signal PSC to the second phase compensation circuit 420, and outputs the start signal VST and the reset signal RST to the second phase compensation circuit 420 in response to the gate start pulse GSP.

The second level shifter 320 generates the first clock signal CLK1 to the tenth clock signal CLK10 based on the timing-delayed gate clock signal F_GCLK2 and the timing-delayed master clock signal F_MCLK2, and outputs the first clock signal CLK1 to the tenth clock signal CLK10 to the second shift register 520. The first clock signal CLK1 to the tenth clock signal CLK10 output from the second level shifter 320 have respectively different phases from the first clock signal CLK1 to the tenth clock signal CLK10 output from the first level shifter 310.

The first phase compensation circuit 410 compensates for a phase of each of the start signal VST and the reset signal RST based on the phase compensation signal PSC, and outputs the compensated start signal P_VST and the compensated reset signal P_RST to the first shift register 510.

The second phase compensation circuit 420 compensates for a phase of each of the start signal VST and the reset signal RST based on the phase compensation signal PSC and outputs the compensated start signal P_VST and the compensated reset signal P_RST to the second shift register 520. That is, the second phase compensation circuit 420 adjusts the phases of the start signal (VST) and the reset signal (RST) based on the phase compensation signal PSC to compensate for the phase delayed by the phase shift filter 200.

The first shift register 510 sequentially outputs the first gate signal P_Gate Out 1 to the 2160 gate signal P_Gate Out 2160 in response to the compensated start signal P_VST. The first shift register 510 initializes a specific node of an internal circuit to the base voltage or power voltage in response to the compensated reset signal P_RST.

The second shift register 520 sequentially outputs the first gate signal P_Gate Out1 to the 2160-th gate signal P_Gate Out 2160 in response to the compensated start signal P_VST. The second shift register 520 initializes a specific node of the internal circuit to the base voltage or power voltage in response to the compensated reset signal P_RST. That is, the second shift register 520 outputs first gate signals (P_Gate Out1) to 2160th gate signals (P_Gate Out2160) having the same phase as the signals of the first shift register 510 in response to the compensation start signal (P_VST). In this way, this embodiment can reduce EMI through timing distribution of the gate clock signal. This embodiment outputs the first gate signals (P_Gate Out1) to the 2160th gate signals (P_Gate Out2160) having the same phase between the first shift register 510 and the second shift register 520 through phase compensation. This can prevent screen steps on the left and right sides of the display panel.

The gate signal generator may be provided on each of left and right sides of each of the first panel B1 to the fourth panel B4. The gate signal generator may adjust the phase of the gate clock signal (the level shifter~ shift register) to disperse EMI. The first phase compensation circuit 410 and the second phase compensation circuit 420 may be provided in a dummy stage of the shift register. In one example, each of the first shift register 510 and the second shift register 520 may include a plurality of stages sequentially operating in response to the compensated start signal P_VST. The plurality of stages sequentially output the first gate signal P_Gate Out 1 to the 2160-th gate signal P_Gate Out 2160.

In this regard, at least one of the first stage and the last stage among the plurality of stages may be used as the dummy stage. For example, when the first stage acts as the dummy stage, the compensated start signal P_VST may be output to the second stage. When the last stage acts as the dummy stage, the compensated start signal P_VST may be output to a next-to-last stage. In other words, the phase compensation circuit is disposed in the dummy stage of the shift register to prevent screen discontinuity of the left and right sides of the panel.

A T1 period is a period for generating a difference between phases of the first level shifter 310 and the second level shifter 320. A T2 period is a period during which the phases of the first shift register 510 and the second shift register 520 are equally compensated for.

The timing controller 100 provides the phase compensation signal PSC along with the gate start pulse GSP, the gate clock signal GCLK1, and the master clock signal MCLK1 to the first level shifter 310 and the second level shifter 320. The phase shift filter 200 is provided between the timing controller 100 and the second level shifter 320 so as to provide the timing-delayed gate clock signal F_GCLK2 and the timing-delayed master clock signal F_MCLK2 to the second level shifter 320.

The first level shifter 310 provides a level-shifted first clock signal CLK1 to a level-shifted second clock signal CLK10 to the first shift register 510. The second level shifter 320 provides the level-shifted first clock signal CLK1 to the level-shifted second clock signal CLK10 to the second shift register 520.

Then, the first level shifter 310 provides the phase compensation signal PSC, the start signal VST, and the reset signal RST to the first phase compensation circuit 410. The second level shifter 320 provides the phase compensation signal PSC, the start signal VST, and the reset signal RST to the second phase compensation circuit 420. Each of the first phase compensation circuit 410 and the second phase compensation circuit 420 compensates for the phases of the start signal VST and the reset signal RST. Then, the first phase compensation circuit 410 provides the phase-compensated start signal P_VST and the phase-compensated reset signal P_RST to the first shift register 510. The second phase compensation circuit 420 provides the phase-compensated start signal P_VST and the phase-compensated reset signal P_RST to the second shift register 520.

Each of the first shift register 510 and the second shift register 520 outputs the phase-compensated first to 2160-th gate signal P_Gate Out 1 to P_Gate Out 2160 to the gate line of the display panel in response to the phase-compensated start signal P_VST and the phase-compensated reset signal P_RST.

The panel of the micro-LED display device according to an embodiment is designed to cancel noise caused by the gate clock signal. That is, the pseudo signal line L2 corresponding to the gate clock line L1 disposed on the upper substrate 10 may be disposed on the lower substrate 20. Further, based on the impedance between the level shifter and the shift register, a shape of the pseudo signal line is structured.

Further, a path of the pseudo signal line L2 is designed to be stabilized and is designed to compensate for the timing dispersion related to the gate signal. The dispersion compensation circuit 44 is disposed on the lower substrate 20. The dispersion compensation circuit 44 is configured to compensate the gate clock signal timing-dispersed and delayed relative to the reference gate signal for the timing thereof to generate a compensated gate clock signal: and supply the compensated gate clock signal to the gate clock line L1 of the upper substrate 10.

Moreover, in the micro-LED display device according to an embodiment, the conductive adhesive and the sealant may be applied for fixation of the upper and lower substrates 10 and 20 to each other such that the ground plane (GND plane) may be expanded. In designing of the upper routing, the sealant is designed to be grounded.

Moreover, in the micro-LED display device according to an embodiment, the inverting circuit may generate the inverted signal of the output of the level shifter in the printed circuit board 40 so as to cancel the noise caused by the gate clock signal.

A first aspect of the present disclosure provides a micro-LED display device comprising: an upper substrate having a micro-LED mounted thereon, wherein a gate clock line receiving a gate clock signal is disposed on the upper substrate: and a lower substrate connected to the upper substrate via a routing, wherein a base voltage line receiving a base voltage is disposed on the lower substrate. A pseudo signal line receiving a pseudo signal for canceling noise generated by the gate clock signal is disposed on the lower substrate.

In some implementations of the micro-LED display device, the pseudo signal supplied to the pseudo signal line of the lower substrate has the same pattern as a pattern of an inverted signal obtained by inverting the gate clock signal supplied to the gate clock line of the upper substrate.

In some implementations of the micro-LED display device, the micro-LED display device further comprises an inverting circuit for inverting the gate clock signal to generate an inverted signal and supplying the inverted signal to the pseudo signal line as the pseudo signal.

In some implementations of the micro-LED display device, the inverting circuit is disposed at one side adjacent to an upper side area or a lower side area of the micro-LED display device and on the lower substrate.

In some implementations of the micro-LED display device, the inverting circuit is formed on a printed circuit board for generating a driving signal of the micro-LED.

In some implementations of the micro-LED display device, the inverting circuit is mounted on a rear surface of the lower substrate and at a position adjacent to a position of the rear surface to which a Chip On Film (COF) is attached, or the inverting circuit is mounted on the rear surface of the lower substrate and at one side adjacent to an upper side area of the micro-LED display device.

In some implementations of the micro-LED display device, the inverting circuit is mounted on the lower substrate and between the pseudo signal line and a printed circuit board generating a driving signal of the micro-LED.

In some implementations of the micro-LED display device, a termination of the pseudo signal line is formed in a serpent pattern, based on a slew of the gate clock signal.

In some implementations of the micro-LED display device, the termination is defined as an end of the pseudo signal line adjacent to a ground, and the end of the pseudo signal line is formed in a pulse-shaped serpent pattern or formed in a gently curved serpent pattern.

In some implementations of the micro-LED display device, an auxiliary gate clock line (or a further gate clock line) connected to the gate clock line of the upper substrate is disposed on the lower substrate.

In some implementations of the micro-LED display device, the micro-LED display device further comprises a slew compensation circuit configured to: sense the gate clock signal transmitted from the auxiliary gate clock line: and compensate for the slew of the gate clock signal to generate an inverted signal as the gate clock signal in which the slew has been compensated for: and supply the inverted signal to the pseudo signal line as the pseudo signal.

In some implementations of the micro-LED display device, the upper substrate and the lower substrate are connected to each other via a routing of an upper side area and a routing of a lower side area.

In some implementations of the micro-LED display device, a conductive adhesive is disposed between the upper substrate and the lower substrate in the upper side area.

In some implementations of the micro-LED display device, the conductive adhesive is connected to a base voltage electrode of the upper substrate and a base voltage electrode of the lower substrate via the routing of the upper side area.

In some implementations of the micro-LED display device, a conductive adhesive and an insulating sealant are disposed between the upper substrate and the lower substrate in the lower side area.

In some implementations of the micro-LED display device, the insulating sealant is disposed between the conductive adhesive and the routing of the lower side area.

In some implementations of the micro-LED display device, the micro-LED display device further comprises a dispersion compensation circuit configured to: compensate a gate clock signal timing-dispersed and delayed relative to a reference gate signal for the timing thereof to generate a compensated gate clock signal: and supply the compensated gate clock signal to the gate clock line of the upper substrate.

In some implementations of the micro-LED display device, the dispersion compensation circuit is disposed at least one of the gate clock line and the pseudo signal line.

In some implementations of the micro-LED display device, the noise to be cancelled is low-frequency noise.

In some implementations of the micro-LED display device, the pseudo signal is defined as a signal that cancels noise by reducing a peak current generated during a transition period of a gate clock signal used to drive the micro-LED.

A second aspect of the present disclosure provides a tiling display apparatus comprising: a first panel: a second panel: and a control circuit FPGA configured to output a reference gate signal to the first panel and to output a timing-delayed gate clock signal to the second panel, wherein each of the first panel and the second panel includes an upper substrate and a lower substrate, wherein the upper substrate and the lower substrate are connected to each other via a routing, wherein a dispersion compensation circuit is disposed on at least one of the upper substrate and the lower substrate, wherein the dispersion compensation circuit is configured to compensate for a timing of each of the reference gate signal and the timing-delayed gate clock signal.

In some implementations of the tiling display apparatus, a micro-LED is mounted on the upper substrate, wherein a gate clock line receiving a gate clock signal is disposed on the upper substrate, wherein the lower substrate is connected to the upper substrate via the routing, wherein a base voltage line receiving a base voltage is disposed on the lower substrate, wherein a pseudo signal line receiving a pseudo signal for canceling noise generated by the gate clock signal is disposed on the lower substrate.

In some implementations of the tiling display apparatus, the pseudo signal supplied to the pseudo signal line of the lower substrate has the same pattern as a pattern of an inverted signal obtained by inverting the gate clock signal supplied to the gate clock line of the upper substrate.

In some implementations of the tiling display apparatus, the tiling display apparatus further comprises an inverting circuit for inverting the gate clock signal to generate an inverted signal and supplying the inverted signal to the pseudo signal line as the pseudo signal.

In some implementations of the tiling display apparatus, the dispersion compensation circuit is disposed at least one of the pseudo signal line and the gate clock line adjacent to a routing of an upper side area.

According to the embodiments, the EMI caused by the gate clock signal of the upper substrate 10 may be cancelled by designing a pattern and a circuit for reducing low-frequency noise in the lower substrate 20 of the micro-LED display device.

Moreover, a stable voltage supply may be guaranteed by applying the conductive adhesive 30 between the upper substrate 10 and the lower substrate 20.

Moreover, supplying the phase compensation signal through the lower substrate 20 may allow the prevention of screen discontinuity due to timing dispersion.

Moreover, the EMI caused by the gate clock signal (or gate clock EMI) may be reduced without interfering with the operation of the light-emissive area within the structural limitations of the pattern design in the micro-LED display device or a micro-LED unit.

Moreover, the side effects of the timing dispersion technology applied to solve the noise overlapping phenomenon may be reduced.

Moreover, EMI may be reduced due to the presence of the ground plane between the upper substrate 10 and the lower substrate 20.

Moreover, the conductive adhesive 30 and the sealant 50 may be applied for fixation of the upper and lower substrates 10 and 20 to each other such that the ground plane (GND plane) may be expanded.

Although the embodiments of the present disclosure have been described in more detail with reference to the accompanying drawings, the present disclosure is not necessarily limited to these embodiments, and may be modified in a various manner within the scope of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

Also Disclosed Herein:

1. A micro-LED display device comprising:
   an upper substrate having a micro-LED mounted thereon, wherein a gate clock line arranged to receive a gate clock signal is disposed on the upper substrate; and
   a lower substrate connected to the upper substrate via a routing, wherein a base voltage line arranged to receive a base voltage is disposed on the lower substrate,
2. The micro-LED display device of clause 1 wherein a pseudo signal line arranged to receive a signal for cancelling noise generated by the gate clock signal is disposed on the lower substrate.
3. The micro-LED display device of clause 1 or 2, wherein the signal supplied to the pseudo signal line of the lower substrate has the same pattern as a pattern of an inverted signal obtained by inverting the gate clock signal supplied to the gate clock line of the upper substrate.
4. The micro-LED display device of any preceding clause, wherein the micro-LED display device further comprises an inverting circuit for inverting the gate clock signal to generate an inverted signal and supplying the inverted signal to the pseudo signal line as the signal.
5. The micro-LED display device of clause 4, wherein the inverting circuit is disposed at one side adjacent to an upper side area or a lower side area of the micro-LED display device and on the lower substrate.
6. The micro-LED display device of any of clauses 4 or 5, wherein the inverting circuit is formed on a printed circuit board for generating a driving signal of the micro-LED.
7. The micro-LED display device of clause 4, wherein the inverting circuit is mounted on a rear surface of the lower substrate and at a position adjacent to a position of the rear surface to which a Chip On Film is attached, or the inverting circuit is mounted on the rear surface of the lower substrate and at one side adjacent to an upper side area of the micro-LED display device.
8. The micro-LED display device of clause 4, wherein the inverting circuit is mounted on the lower substrate and between the pseudo signal line and a printed circuit board generating a driving signal of the micro-LED.
9. The micro-LED display device of any preceding clause, wherein a termination of the pseudo signal line is formed in a serpent pattern, based on a slew of the gate clock signal.
10. The micro-LED display device of clause 9, wherein the termination is defined as an end of the pseudo signal line adjacent to a ground, and the end of the pseudo signal line is formed in a pulse-shaped serpent pattern or formed in a gently curved serpent pattern.
11. The micro-LED display device of any preceding clause, wherein an auxiliary gate clock line connected to the gate clock line of the upper substrate is disposed on the lower substrate.
12. The micro-LED display device of clause 10, wherein the micro-LED display device further comprises a slew compensation circuit configured to:
   sense the gate clock signal transmitted from the auxiliary gate clock line; and
   compensate for the slew of the gate clock signal to generate an inverted signal as the gate clock signal in which the slew has been compensated for; and
   supply the inverted signal to the pseudo signal line as the signal.
13. The micro-LED display device of any preceding clause, wherein the upper substrate and the lower substrate are connected to each other via routing of an upper side area and routing of a lower side area.
14. The micro-LED display device of clause 13, wherein a conductive adhesive is disposed between the upper substrate and the lower substrate in the upper side area.
15. The micro-LED display device of clause 14, wherein the conductive adhesive is connected to a base voltage electrode of the upper substrate and a base voltage electrode of the lower substrate via the routing of the upper side area.
16. The micro-LED display device of clause 13, wherein a conductive adhesive and an insulating sealant are disposed between the upper substrate and the lower substrate in the lower side area.
17. The micro-LED display device of clause 16, wherein the insulating sealant is disposed between the conductive adhesive and the routing of the lower side area.
18. The micro-LED display device of any preceding clause, wherein the micro-LED display device further comprises a dispersion compensation circuit configured to:
   compensate a gate clock signal timing-dispersed and delayed relative to a reference gate signal for the timing thereof to generate a compensated gate clock signal; and
   supply the compensated gate clock signal to the gate clock line of the upper substrate.

19. The micro-LED display device of clause 18, wherein the dispersion compensation circuit is disposed at least one of the gate clock line and the pseudo signal line.
20. The micro-LED display device of any preceding clause, wherein the noise to be cancelled is low-frequency noise.
21 The micro-LED display device of any preceding clause, wherein the signal is defined as a signal that cancels noise by reducing a peak current generated during a transition period of a gate clock signal used to drive the micro-LED.

What is claimed is:

1. A display apparatus, comprising:
a first panel;
a second panel; and
a control circuit configured to output a reference gate signal to the first panel and to output a timing-delayed gate clock signal to the second panel,
wherein:
at least one of the first and second panels comprises an upper substrate having a micro-LED mounted thereon and a lower substrate connected to the upper substrate via routing, and
wherein the at least one of the first and second panels comprises:
a gate clock line arranged to receive a gate clock signal, the gate clock line being disposed on the upper substrate; and
a base voltage line arranged to receive a base voltage, the base voltage line being disposed on the lower substrate.

2. The display apparatus of claim 1, wherein a pseudo signal line arranged to receive a signal for canceling noise generated by the gate clock signal is disposed on the lower substrate.

3. The display apparatus of claim 2, wherein the signal supplied to the pseudo signal line of the lower substrate has the same pattern as a pattern of an inverted signal obtained by inverting the gate clock signal supplied to the gate clock line of the upper substrate.

4. The display apparatus of claim 2, wherein the display apparatus further comprises an inverting circuit for inverting the gate clock signal to generate an inverted signal and supplying the inverted signal to the pseudo signal line as the signal.

5. The display apparatus of claim 4, wherein the inverting circuit is disposed at one side adjacent to an upper side area or a lower side area of the display apparatus and on the lower substrate.

6. The display apparatus of claim 4, wherein the inverting circuit is formed on a printed circuit board for generating a driving signal of the micro-LED.

7. The display apparatus of claim 4, wherein the inverting circuit is mounted on a rear surface of the lower substrate and at a position adjacent to a position of the rear surface to which a chip on film is attached, or the inverting circuit is mounted on the rear surface of the lower substrate and at one side adjacent to an upper side area of the display apparatus.

8. The display apparatus of claim 4, wherein the inverting circuit is mounted on the lower substrate and between the pseudo signal line and a printed circuit board for generating a driving signal of the micro-LED.

9. The display apparatus of claim 2, wherein the noise to be cancelled is low-frequency noise.

10. The display apparatus of claim 2, wherein the signal is defined as a signal that cancels the noise by reducing a peak current generated during a transition period of the gate clock signal used to drive the micro-LED.

11. The display apparatus of claim 2, wherein a termination of the pseudo signal line is formed in a serpent pattern, based on a slew of the gate clock signal.

12. The display apparatus of claim 11, wherein the termination is defined as an end of the pseudo signal line adjacent to a ground, and the end of the pseudo signal line is formed in a pulse-shaped serpent pattern or formed in a gently curved serpent pattern.

13. The display apparatus of claim 2, wherein an auxiliary gate clock line connected to the gate clock line of the upper substrate is disposed on the lower substrate.

14. The display apparatus of claim 13, wherein the display apparatus further comprises a slew compensation circuit configured to:
sense the gate clock signal transmitted from the auxiliary gate clock line; and
compensate for a slew of the gate clock signal to generate an inverted signal as the gate clock signal in which the slew has been compensated for; and
supply the inverted signal to the pseudo signal line as the signal.

15. The display apparatus of claim 2, wherein the display apparatus further comprises a dispersion compensation circuit configured to:
compensate a gate clock signal timing-dispersed and delayed relative to the reference gate signal for a timing thereof to generate a compensated gate clock signal; and
supply the compensated gate clock signal to the gate clock line of the upper substrate.

16. The display apparatus of claim 15, wherein the dispersion compensation circuit is disposed at at least one of the gate clock line and the pseudo signal line.

17. The display apparatus of claim 15, wherein the dispersion compensation circuit is disposed on at least one of the upper substrate and the lower substrate, and
wherein the dispersion compensation circuit is configured to compensate for a timing of each of the reference gate signal and the timing-delayed gate clock signal.

18. The display apparatus of claim 15, wherein the dispersion compensation circuit is disposed adjacent to a routing of an upper side area.

19. The display apparatus of claim 1, wherein the upper substrate and the lower substrate are connected to each other via routing of an upper side area and routing of a lower side area.

20. The display apparatus of claim 19, wherein a conductive adhesive is disposed between the upper substrate and the lower substrate in the upper side area.

21. The display apparatus of claim 20, wherein the conductive adhesive is connected to a base voltage electrode of the upper substrate and a base voltage electrode of the lower substrate via the routing of the upper side area.

22. The display apparatus of claim 19, wherein a conductive adhesive and an insulating sealant are disposed between the upper substrate and the lower substrate in the lower side area.

23. The display apparatus of claim 22, wherein the insulating sealant is disposed between the conductive adhesive and the routing of the lower side area.

24. The display apparatus of claim 1, comprising a third panel and a fourth panel.

25. The display apparatus of claim 24, wherein the control circuit is arranged to output the reference gate signal to the second panel and the third panel and is arranged to output the timing-delayed gate clock signal to the first panel and the fourth panel.

26. The display apparatus of claim 24, wherein the control circuit is positioned in the middle of the first, second, third and fourth panels when the first, second, third and fourth panels are tiled together.

* * * * *